United States Patent
Kelty

(10) Patent No.: US 9,874,708 B2
(45) Date of Patent: Jan. 23, 2018

(54) OPTICAL MODULE BLIND MATING HEAT RELAY SYSTEM

(71) Applicant: Infinera Corp., Annapolis Junction, MD (US)

(72) Inventor: Matthew James Kelty, Cambria, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 14/985,665

(22) Filed: Dec. 31, 2015

(65) Prior Publication Data

US 2017/0192184 A1   Jul. 6, 2017

(51) Int. Cl.
*G02B 6/42* (2006.01)
*H05K 7/20* (2006.01)

(52) U.S. Cl.
CPC ........... *G02B 6/4269* (2013.01); *G02B 6/428* (2013.01); *G02B 6/4292* (2013.01); *H05K 7/2039* (2013.01); *H05K 7/20336* (2013.01)

(58) Field of Classification Search
CPC .... G02B 6/4269; G02B 6/4292; G02B 6/428; H05K 7/20336; H05K 7/2039
See application file for complete search history.

(56) References Cited

U.S. PATENT DOCUMENTS

| | | | | |
|---|---|---|---|---|
| 4,880,052 A * | 11/1989 | Meyer, IV | .......... | F28D 15/0233 165/104.14 |
| 5,549,155 A * | 8/1996 | Meyer, IV | .......... | F28D 15/0275 165/104.33 |
| 5,568,360 A * | 10/1996 | Penniman | ............... | G06F 1/203 165/104.33 |
| 5,734,550 A * | 3/1998 | Penniman | ............... | G06F 1/203 165/185 |
| 5,764,482 A * | 6/1998 | Meyer, IV | ............ | H01L 23/427 165/80.4 |
| 5,844,777 A * | 12/1998 | Gates | .................. | H05K 7/20809 165/185 |
| 6,118,654 A * | 9/2000 | Bhatia | .................... | G06F 1/1632 165/104.14 |
| 6,172,871 B1 * | 1/2001 | Holung | ................. | G06F 1/1632 165/104.33 |
| 6,560,104 B2 * | 5/2003 | DeHoff | .................... | G06F 1/203 165/104.33 |

(Continued)

*Primary Examiner* — Peter Radkowski

(74) *Attorney, Agent, or Firm* — Dunlap Codding PC; David L. Soltz

(57) ABSTRACT

An optical module blind mating heat relay system, comprising a linecard comprising a circuit board; a heat relay apparatus comprising a first heat pipe on the circuit board, a radiator attached to the circuit board and in thermal contact with the first heat pipe; a heat relay receiver assembly comprising a receiver housing having a slot and a contact slug connected to the receiver housing and in thermal contact with the first heat pipe; a pluggable optical module removably engaged with the linecard; and a second heat pipe having a pluggable optical module portion contacting the pluggable optical module and having a plug portion removably positioned within the slot of the receiver housing, the plug portion in thermal contact with the contact slug, the second heat pipe removable from the receiver housing while the linecard is receiving electrical power.

20 Claims, 7 Drawing Sheets

(56) References Cited

U.S. PATENT DOCUMENTS

| | | | | |
|---|---|---|---|---|
| 6,674,643 B2* | 1/2004 | Centola | ............ | H05K 7/20672 165/104.33 |
| 6,800,077 B1* | 10/2004 | Mucko | ............ | A61B 18/1442 606/51 |
| 6,914,780 B1* | 7/2005 | Shanker | ............ | F28D 15/0233 165/104.33 |
| 6,966,358 B2* | 11/2005 | Rapaich | ............ | G06F 1/1632 165/104.33 |
| 7,231,961 B2* | 6/2007 | Alex | ............ | F28D 15/0266 165/104.33 |
| 7,729,121 B1* | 6/2010 | Deshpande | ............ | H01L 23/3677 165/80.3 |
| 7,936,560 B2* | 5/2011 | Toyoda | ............ | F28D 15/043 165/104.21 |
| 8,804,338 B2* | 8/2014 | Nagasawa | ............ | G06F 1/203 165/185 |
| 9,261,310 B2* | 2/2016 | Fried | ............ | F28D 15/0266 |
| 9,268,376 B2* | 2/2016 | Winkler | ............ | G06F 1/203 |
| 2003/0030986 A1* | 2/2003 | Centola | ............ | H05K 7/20672 361/720 |
| 2005/0161197 A1* | 7/2005 | Rapaich | ............ | G06F 1/1632 165/80.4 |
| 2005/0217829 A1* | 10/2005 | Belits | ............ | F28D 15/0266 165/104.33 |
| 2007/0034360 A1* | 2/2007 | Hall | ............ | G06F 1/183 165/104.33 |
| 2010/0073866 A1* | 3/2010 | Toyoda | ............ | F28D 15/043 361/679.47 |
| 2012/0236501 A1* | 9/2012 | Nagasawa | ............ | G06F 1/203 361/701 |
| 2013/0228313 A1* | 9/2013 | Fried | ............ | F28D 15/0266 165/104.26 |
| 2014/0192480 A1* | 7/2014 | Winkler | ............ | G06F 1/203 361/679.47 |

\* cited by examiner

OPTICAL MODULE BLIND MATING HEAT RELAY SYSTEM

FIELD OF THE DISCLOSURE

The disclosure generally relates to heat relay systems for optical modules used in telecommunication systems. More particularly, but not by way of limitation, the inventive concepts disclosed herein relate to blind mating heat relay systems for pluggable hot-swappable optical multiplexer modules, such as optical modules plugged into a linecard.

BACKGROUND

Telecommunication system circuit packs including pluggable module housings are deployed in various communication networks and are configured to allow for the hot insertion and hot removal of a variety of pluggable modules. Components that allow for hot insertion and hot removal are known as "hot-swappable." Hot-swappable components can be inserted and/or removed in the field without disassembling the host system, for example, while the host system is in use and/or without interrupting electrical power.

For example, pluggable optical modules used in telecommunication systems are typically hot swappable. Pluggable optical modules are generally plugged into a linecard by sliding or otherwise inserting the pluggable optical module into a housing of the linecard while the linecard continues to receive power. The pluggable optical modules may be positioned in the linecard vertically adjacent to one another and/or laterally adjacent to one another.

However, it may be difficult to disperse the heat produced by pluggable optical modules inserted in the linecard. If the heat is not dispersed, the pluggable optical modules and/or the linecard may reach a temperature at which the pluggable optical modules and/or the linecard fail to function properly, or ceases functioning all together.

Therefore, there exists a need for a system to disperse heat from optical module systems, including optical modules pluggably engaged with linecards.

SUMMARY

Systems are disclosed that transfer heat from a blind mated optical module to a main chassis or optical linecard. Systems are disclosed that transfer heat from a heat pipe to a heat dispersal system where the connection between the heat pipe and the heat dispersal system is not permanent. Systems and components are disclosed that manage the dispersal of heat from linecard systems, including pluggable optical modules pluggably engaged with a linecard.

BRIEF DESCRIPTION OF THE DRAWINGS

Certain embodiments of the inventive concepts will hereafter be described with reference to the accompanying drawings, wherein like reference numerals denote like elements. It should be understood, however, that the accompanying figures illustrate the various implementations described herein and are not meant to limit the scope of the various technologies described herein.

DETAILED DESCRIPTION

Figure 1:
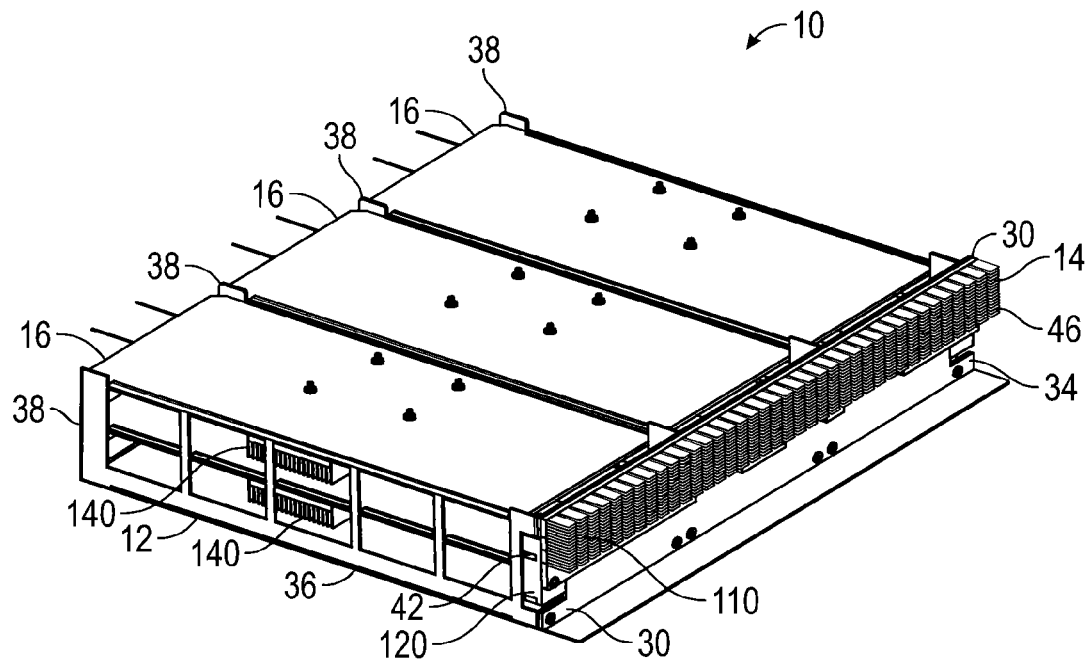
FIG. 1 is a rear top perspective view of an optical module blind mating heat relay system constructed in accordance with the inventive concepts disclosed herein.

The following detailed description refers to the accompanying drawings. The same reference numbers in different drawings may identify the same or similar elements.

The mechanisms proposed in this disclosure circumvent the problems described above. Conventionally, pluggable optical modules used in linecards have encountered operational problems when overheated. The present disclosure describes systems for dispersal of heat from pluggable optical modules and linecards.

Consistent with an aspect of the present disclosure, an optical module blind mating heat relay system comprises a linecard. The linecard has a circuit board having a front side connectable to a pluggable optical module and a back side opposite the front side. Consistent with an aspect of the present disclosure, the back side of the circuit board is connectable to external devices. Consistent with an aspect of the present disclosure, the circuit board is a midplane circuit board.

Consistent with an aspect of the present disclosure, the system further has a heat relay apparatus comprising a midplane heat pipe (a first heat pipe) on the circuit board. The heat relay apparatus further comprises a radiator attached to the circuit board and in thermal contact with the midplane heat pipe. The heat relay apparatus further comprises a heat relay receiver assembly comprising a receiver housing having a slot and a contact slug connected to the receiver housing and in thermal contact with the midplane heat pipe, the contact slug composed of thermally conductive material.

Consistent with an aspect of the present disclosure, the system further comprises a pluggable optical module removably engaged with the linecard and a pluggable optical module heat pipe (a second heat pipe) having a cross section with a substantially rectangular shape. The pluggable optical module heat pipe may have a pluggable optical module portion contacting the pluggable optical module and a plug portion removably positioned within the slot of the receiver housing. The plug portion may be in thermal contact with the contact slug. The pluggable optical module heat pipe may be removable from the receiver housing while the linecard is receiving electrical power.

Consistent with an aspect of the present disclosure, an optical module blind mating heat relay system comprises a linecard comprising a circuit board having a front side connectable to a pluggable optical module and a back side opposite the front side. The optical module blind mating heat relay system has a heat relay apparatus comprising a first heat pipe on the circuit board; a radiator in thermal contact with the first heat pipe; a first heat relay receiver assembly comprising a first receiver housing having a slot and a first contact slug connected to the first receiver housing and in thermal contact with the first heat pipe, the contact slug composed of thermally conductive material; and a second heat relay receiver assembly comprising a second receiver housing having a slot and a second contact slug connected to the second receiver housing and in thermal contact with the first heat pipe, the contact slug composed of thermally conductive material. The optical module blind mating heat relay system further has a first pluggable optical module removably engaged with the linecard; a second heat pipe having a cross section with a substantially rectangular shape and a pluggable optical module portion contacting the first pluggable optical module, and a plug portion removably positioned within the slot of the first receiver housing, the plug portion being in thermal contact with the first contact slug, the second heat pipe being removable from the first receiver housing while the linecard is receiving electrical power. The optical module blind mating heat relay system has a second pluggable optical module removably engaged with the linecard; and a third heat pipe having a cross section with a substantially rectangular shape and a pluggable optical module portion contacting the second pluggable optical module, and a plug portion removably positioned within the slot of the second receiver housing, the plug portion being in thermal contact with the second contact slug, the third heat pipe being removable from the second receiver housing while the linecard is receiving electrical power.

Consistent with an aspect of the present disclosure, an optical module blind mating heat relay system comprises a linecard comprising a circuit board having a front side connectable to a pluggable optical module and a back side opposite the front side; a heat relay apparatus comprising a first heat pipe on the circuit board, a second heat pipe on the circuit board, a radiator in thermal contact with the first heat pipe and the second heat pipe, a first heat relay receiver assembly comprising a first receiver housing having a slot and a first contact slug connected to the first receiver housing and in thermal contact with the first heat pipe, the contact slug composed of thermally conductive material, and a second heat relay receiver assembly comprising a second receiver housing having a slot and a second contact slug connected to the second receiver housing and in thermal contact with the second heat pipe, the contact slug composed of thermally conductive material. The optical module blind mating heat relay system has a first pluggable optical module removably engaged with the linecard; a third heat pipe having a cross section with a substantially rectangular shape and a pluggable optical module portion contacting the first pluggable optical module, and a plug portion removably positioned within the slot of the first receiver housing, the plug portion being in thermal contact with the first contact slug, the third heat pipe being removable from the first receiver housing while the linecard is receiving electrical power. The optical module blind mating heat relay system further has a second pluggable optical module removably engaged with the linecard; and a fourth heat pipe having a cross section with a substantially rectangular shape and a pluggable optical module portion contacting the second pluggable optical module, and a plug portion removably positioned within the slot of the second receiver housing, the plug portion being in thermal contact with the second contact slug, the fourth heat pipe being removable from the second receiver housing while the linecard is receiving electrical power.

Definitions

If used throughout the description and the drawings, the following short terms have the following meanings unless otherwise stated:

A linecard is an optical linecard. One nonexclusive example of an optical linecard is the Optical Transport Network Tributary Module sold by Infinera Corporation of Sunnyvale, Calif. A pluggable optical module is a customer interface to a long-haul optical telecommunication network. One nonexclusive example of a pluggable optical module is a Tributary Interface Module sold by Infinera Corporation of Sunnyvale, Calif.

DESCRIPTION

Specific embodiments of the inventive concepts disclosed herein will now be described in detail with reference to the accompanying drawings. Further, in the following detailed description of embodiments of the present disclosure, numerous specific details are set forth in order to provide a more thorough understanding of the disclosure. However, it will be apparent to one of ordinary skill in the art that the embodiments disclosed herein may be practiced without these specific details. In other instances, well-known features have not been described in detail to avoid unnecessarily complicating the description.

Unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or at least one and the singular also includes the plural unless otherwise stated.

The terminology and phraseology used herein is for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited or inherently present therein.

As used herein any references to "one embodiment," "an embodiment," or "some embodiments" means that a particular element, feature, structure, or characteristic described in connection with the embodiment is included in at least one embodiment. The appearances of the phrase "in one embodiment" in various places in the specification may not refer to the same embodiment.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

The use of the term "at least one" or "one or more" will be understood to include one as well as any quantity more than one. In addition, the use of the phrase "at least one of X, V, and Z" will be understood to include X alone, V alone, and Z alone, as well as any combination of X, V, and Z.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

It is noted that the terms "top," "bottom," "side," "front," and "rear," as used herein, are for ease of description, and are not intended to limit the orientation of components or the scope of the invention. One of skill in the art will readily appreciate that the physical orientation of an optical-electrical device, such as an optical module, may be positioned in any orientation Typically, the use of heat pipe assemblies with hot-swappable components, such as pluggable optical modules, has been limited since heat pipes typically are soldered together as one inseparable component. Additionally, space for heat dispersal components is limited on hot-swappable components due to requirements for connecting the hot-swappable components and specified spacing in the housings of the receiving components (such as linecards).

Fiber optic modules are typically mounted to a chassis or housing which is then mounted inside an equipment rack or cabinet. The linecards and chasses into which the hot-swappable modules are inserted have potential heat dispersal areas. To utilize the heat dispersal areas of the linecard and/or chasses, systems are needed that transfer heat from the hot-swappable module to the chassis or linecard.

Additionally, conventional heat pipe assemblies encounter problems with tolerance stack ups that cause mounting problems for the heat pipe assemblies. Current heat pipe designs require precise assembly and mounting locations. If a heat pipe assembly is too long, too short, too tall, or non-parallel with the connection, a connected cold plate may not sit properly.

Figure 2:
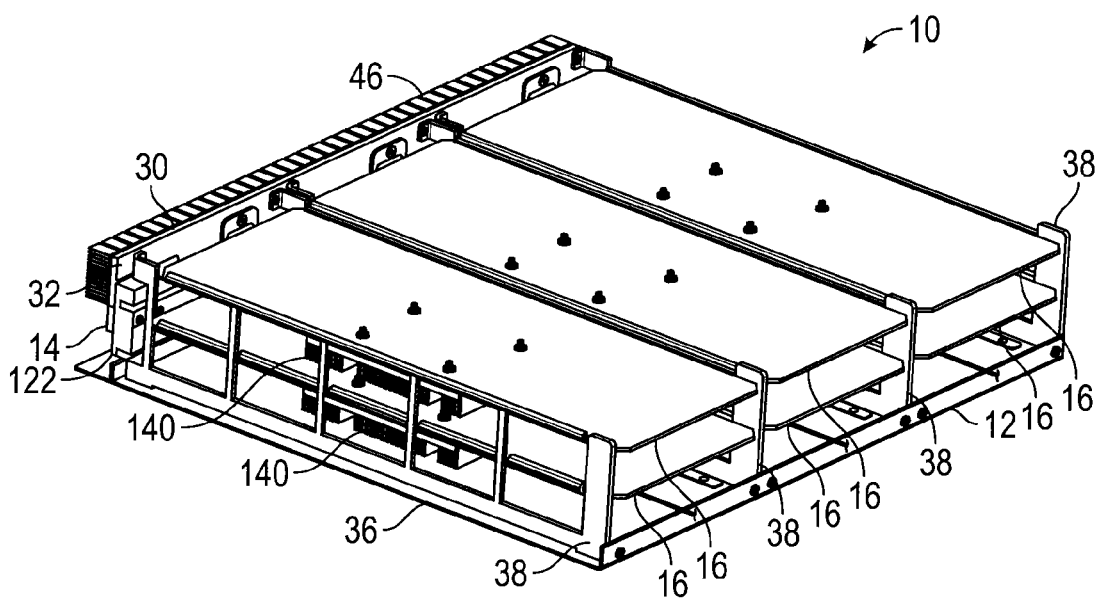
FIG. 2 is a front top perspective view of the optical module blind mating heat relay system of FIG. 1.
Figure 3:
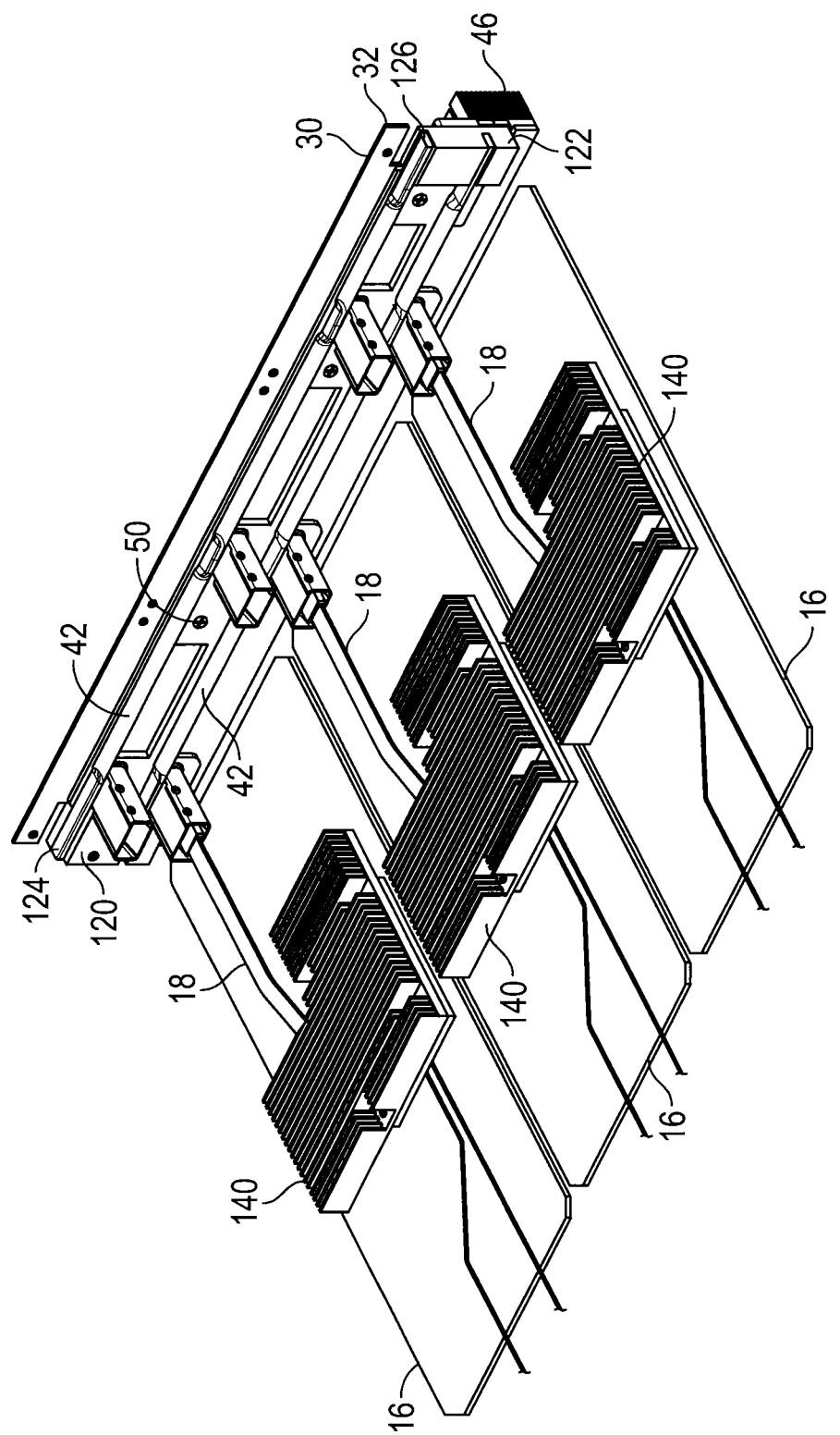
FIG. 3 is a front bottom perspective view of components of the optical module blind mating heat relay system of FIG. 1.

Referring now to the drawings, and in particular to FIGS. 1-3, shown therein and designated by reference numeral 10 is an optical module blind mating heat relay system constructed in accordance with the present invention. In general, the optical module blind mating heat relay system 10 comprises a linecard 12, a heat relay apparatus 14 connected to the linecard 12, at least one pluggable optical module 16 removably engaged with the linecard 12, and at least one pluggable optical module heat pipe 18 contacting the pluggable optical module 16 and removably engaged with the heat relay apparatus 14. In the example shown, the optical module blind mating heat relay system 10 includes six pluggable optical modules 16 and pluggable optical module heat pipes 18 engaged with the heat relay apparatus 14.

The linecard 12 has a circuit board 30 having a front side 32 and a back side 34 opposite the front side 32. The circuit board 30 may be a midplane circuit board 30. The front side 32 of the midplane circuit board 30 is connectable to the pluggable optical module 16. The back side 34 of the midplane circuit board 30 is connectable to external devices, such as other circuit boards, circuitry, electrical connectors, other modules, and so on, as is well known by those having ordinary skill in the art. The linecard 12 may also comprise a support base 36 and card guides 38 removably attached to the support base 36. The card guides 38 and support base 36 may guide and support the pluggable optical module 16 generally toward and away from the midplane circuit board 30. The linecard 12 may be insertable in a telecommunication equipment chassis (not shown). The midplane circuit board 30 may connect the pluggable optical modules 16 to a main circuit board (not shown) of the linecard 12.

Figure 4:
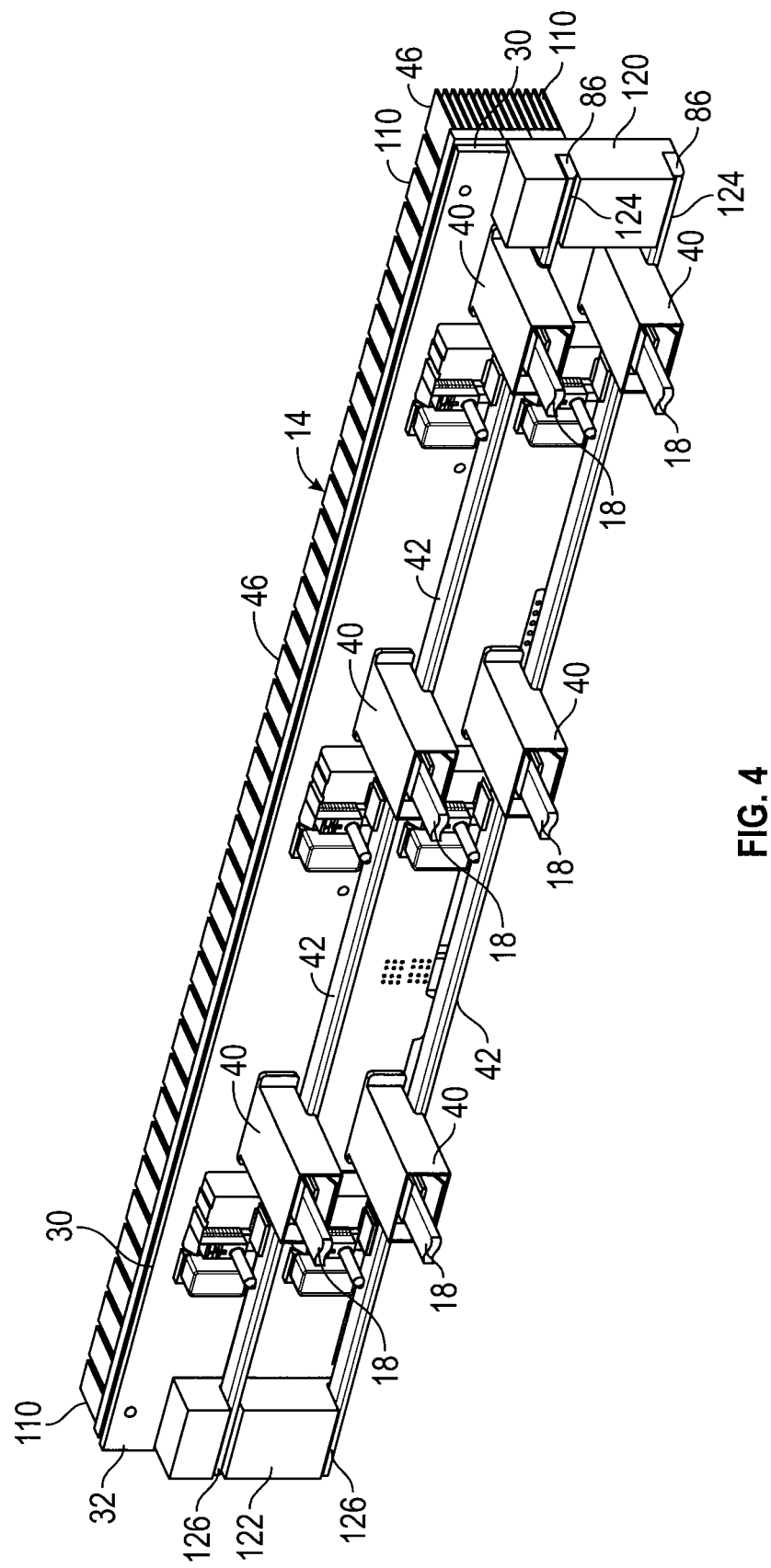
FIG. 4 is a front top perspective view of a heat relay apparatus constructed in accordance with the inventive concepts disclosed herein.
Figure 5:
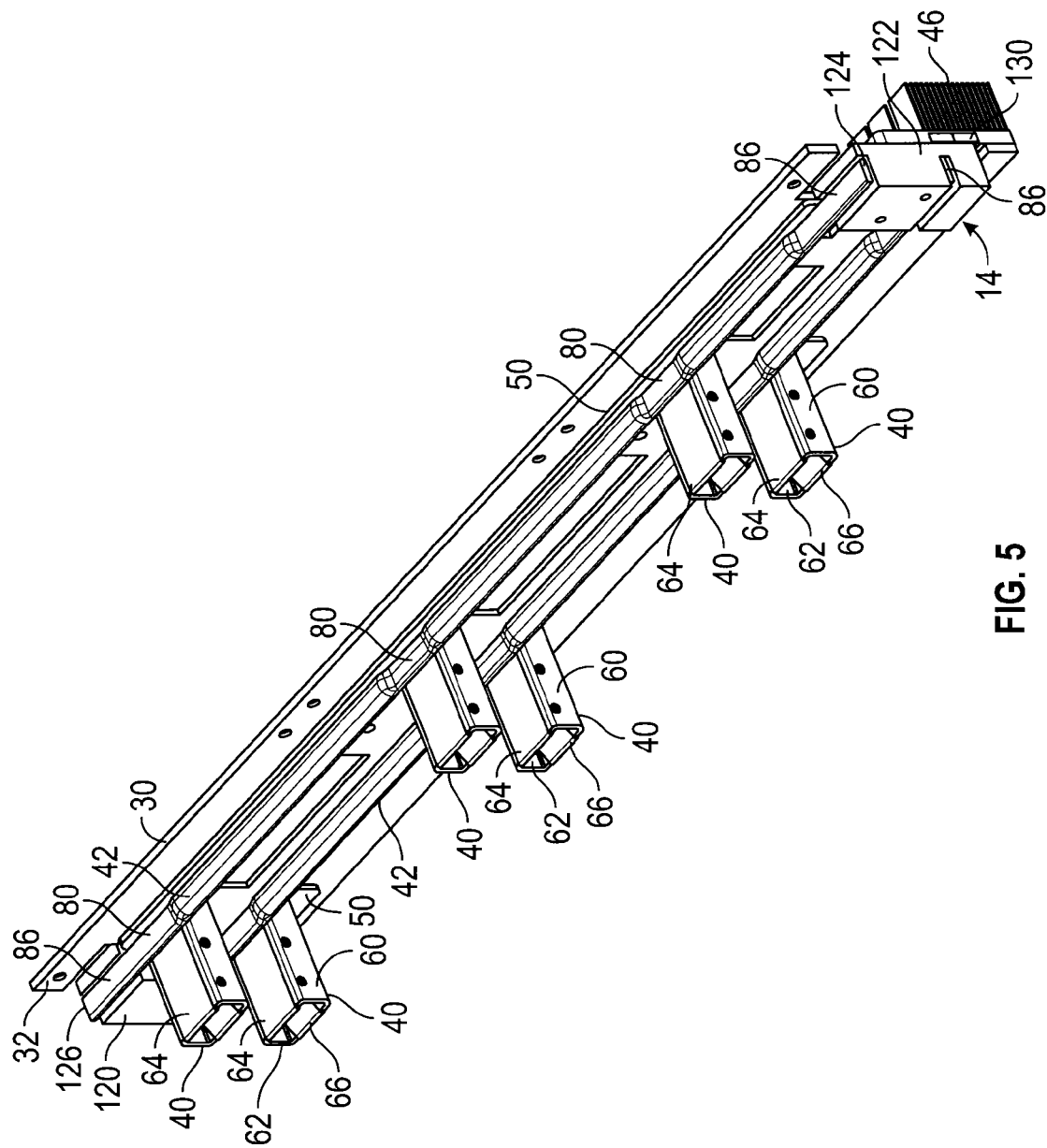
FIG. 5 is a front bottom perspective view of a heat relay apparatus constructed in accordance with the inventive concepts disclosed herein.
Figure 6:
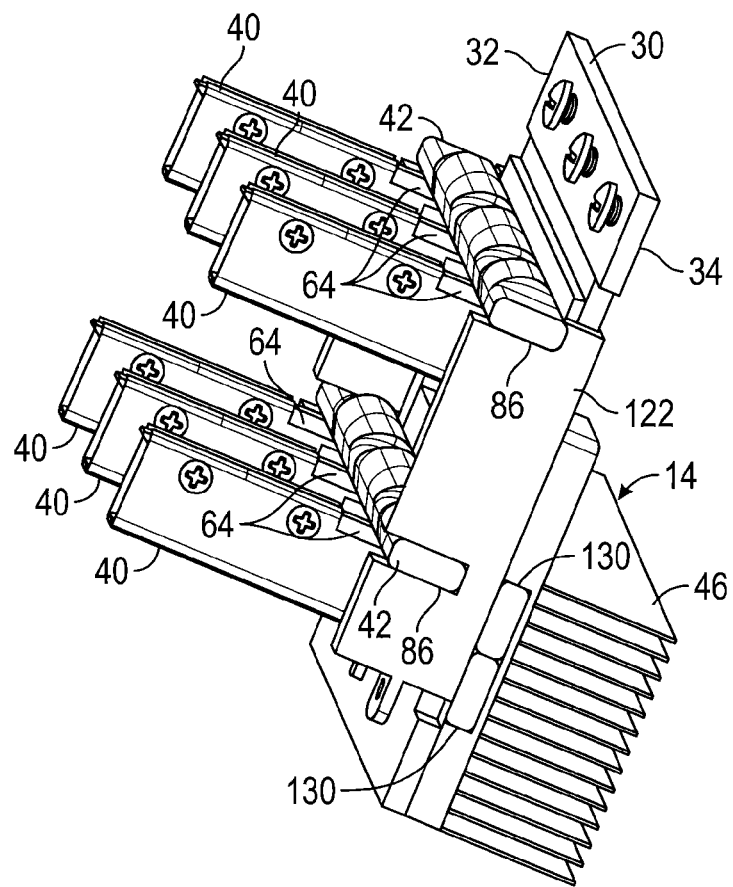
FIG. 6 is a side bottom perspective view of a heat relay apparatus constructed in accordance with the inventive concepts disclosed herein.

As illustrated in FIGS. 4-6, the heat relay apparatus 14 comprises at least one heat relay receiver assembly 40, a midplane heat pipe 42, and a radiator 46. Six heat relay receiver assemblies 40 are depicted by way of example in FIG. 4. The heat relay receiver assemblies 40 are in thermal contact with the midplane heat pipe 42, which is in thermal contact with the radiator 46. The heat relay receiver assembly 40 and the midplane heat pipe 42 may be positioned on the front side 32 of the midplane circuit board 30. The radiator 46 may be positioned on the back side 34 of the midplane circuit board 30. The heat relay receiver assembly 40, midplane heat pipe 42, and radiator 46 may be adjacent to or touching the midplane circuit board 30.

In one aspect of the present disclosure, the heat relay apparatus 14 further comprises a heat relay frame 50 attached to the front side 32 of the midplane circuit board 30. The heat relay receiver assembly 40 and the midplane heat pipe 42 may be attached to the heat relay frame 50.

The exemplary optical module blind mating heat relay system 10 shown in the figures has six heat relay receiver assemblies 40 for explanatory purposes. However, it will be understood that the optical module blind mating heat relay system 10 may have one, two, three, four, five, six, or more of the heat relay receiver assemblies 40.

Figure 7:
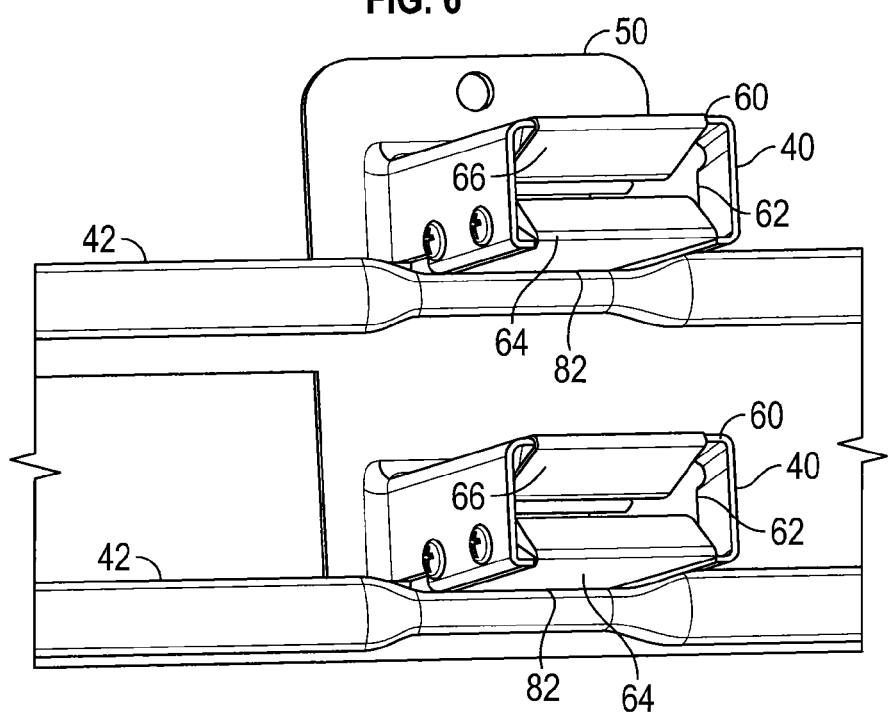
FIG. 7 is a perspective view of components of the heat relay apparatus of FIG. 6.
Figure 8:
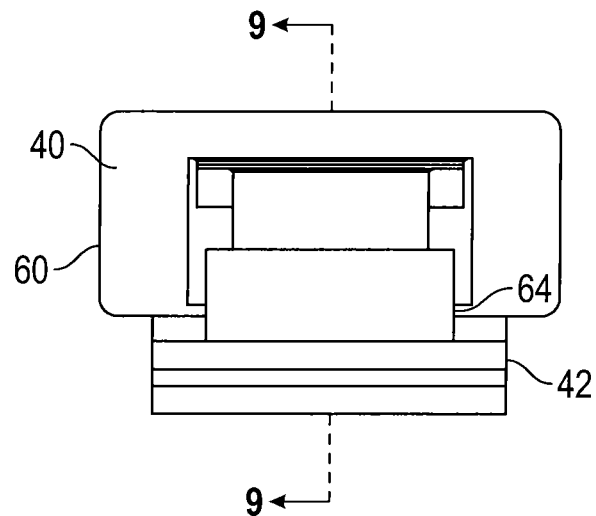
FIG. 8 is a front view of components of the heat relay apparatus of FIG. 6.
Figure 9:
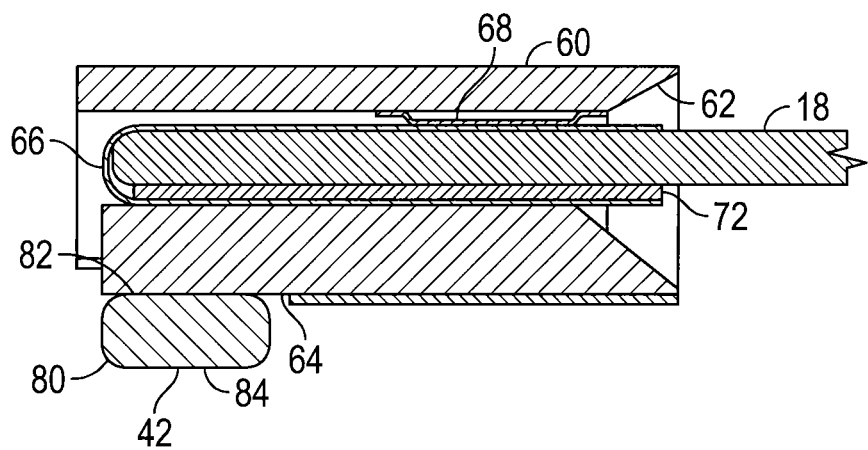
FIG. 9 is a cross sectional view of the heat relay apparatus of FIG. 6.

As illustrated in FIGS. 7-9, the heat relay receiver assembly 40 may have a receiver housing 60 having a slot 62. The receiver housing 60 may be made of plastic, metal, or other material with heat transfer abilities capable of transferring heat from the pluggable optical module heat pipe 18 to the midplane heat pipe 42. The receiver housing 60 may be die cast. The receiver housing 60 may be made of a combination of materials. The slot 62 of the receiver housing 60 is shaped to receive and be removably coupled to the pluggable optical module heat pipe 18. The slot 62 of the receiver housing 60 may be shaped to removably retain the pluggable optical module heat pipe 18 in place in the receiver housing 60.

As shown in FIGS. 6 and 7, the heat relay receiver assembly 40 may further comprise a contact slug 64 in thermal contact with the receiver housing 60. The contact slug 64 may be connected to the receiver housing 60 or part of the receiver housing 60. The contact slug 64 is also in thermal contact with the midplane heat pipe 42. The contact slug 64 may be positioned in, or partially in, the receiver housing 60.

In one aspect of the present disclosure, the contact slug 64 is in thermal contact with the pluggable optical module heat pipe 18 and the midplane heat pipe 42.

In one aspect of the present disclosure, the contact slug 64 is connected to the midplane heat pipe 42, such as by soldering the contact slug 64 to the midplane heat pipe 42.

The contact slug 64 may be made of materials having thermal conductivity sufficient to conduct heat from the system. In one aspect of the present disclosure, the contact slug 64 may be made of thermally conductive material sufficient to transfer heat produced by the pluggable optical module 16. Non-exclusive examples of thermally conductive material include copper and aluminum. In one aspect of the present disclosure, the contact slug 64 is made of aluminum 6063 having a thermal conductivity of approximately 210 W/(m*K). In one aspect of the present disclosure, the contact slug 64 is made of copper having a thermal conductivity of approximately 380 W/(m*K).

In one aspect of the present disclosure, the contact slug 64 is made of copper with nickel plating. Nickel plating may improve heat transfer between surfaces as the nickel plating may increase the flatness of the surfaces, thereby decreasing air gaps between the surfaces and lowering thermal resistance.

In one aspect of the present disclosure, the contact slug 64 has a substantially rectangular shape having a first planar surface configured to matingly engage with the pluggable optical module heat pipe 18. In one aspect of the present disclosure, the contact slug 64 has a second planar surface configured to contact the midplane heat pipe 42. In one aspect of the present disclosure, the contact slug 64 has a length between approximately one and one-third inch and two inches, and a width between one-half inch and one inch.

In one aspect of the present disclosure, the contact slug 64 has an angled leading edge, for ease of insertion of the pluggable optical module heat pipe 18 into the receiver housing 60.

In one aspect of the present disclosure, the heat relay receiver assembly 40 may further comprise a clip 66 located inside the slot 62 of the receiver housing 60. The contact slug 64 may be in thermal contact with the clip 66 in the receiver housing 60. The clip 66 may be shaped to receive and/or removably retain the pluggable optical module heat pipe 18. The clip 66 may aid in reducing wear to the receiver housing 60 and/or the pluggable optical module heat pipe 18, allowing for a greater number of insertions and removals of the pluggable optical module heat pipe 18. The clip 66 may be made of, or lined with, a material having a low coefficient of friction for ease of insertion and removal of the pluggable optical module heat pipe 18. Non-exclusive examples of low friction materials include metal alloys containing copper (for example, bronze), metal alloys plated with nickel, and some plastics (for example, polytetrafluoroethylene). Electroless nickel plating may be used on copper alloys to produce a low friction material, such as electroless nickel plating that has a dynamic friction coefficient against itself of 0.43.

In one aspect of the present disclosure, the first planar surface of the contact slug 64 is configured to contact the clip 66.

As shown in FIG. 9, in one aspect of the present disclosure, the heat relay receiver assembly 40 may further comprise a leaf spring 68 extending into the slot 62 of the receiver housing 60. The leaf spring 68 may oppose the contact slug 64 and thereby bias the pluggable optical module heat pipe 18 toward the contact slug 64. The leaf spring 68 may have any suitable shape such that the pluggable optical module heat pipe 18 is biased toward the contact slug 64. In FIG. 9, the leaf spring 68 is shown having one radial contact point with the pluggable optical module heat pipe 18, however, it will be understood that the leaf spring 68 may have multiple contact points, or be of other shapes, as is well known by one having ordinary skill in the field of mechanical leaf springs 68.

It will be understood that other components may be used with or instead of the leaf spring 68, such that the pluggable optical module heat pipe 18 is biased toward the contact slug 64. Non-exclusive examples include one or more spring and one or more compressible material. Additionally, it will be understood that the receiver housing 60 may be shaped to removably engage the pluggable optical module heat pipe 18 in a biased position with the contact slug 64.

In one aspect of the present disclosure, the heat relay receiver assembly 40 may further comprise a compressible thermal gap filler 72 between the pluggable optical module heat pipe 18 and the contact slug 64. In one aspect of the present disclosure, the heat relay receiver assembly 40 may further comprise the compressible thermal gap filler 72 between the pluggable optical module heat pipe 18 and the clip 66.

The compressible thermal gap filler 72 may be in the form of a pad, a gel, a spring, or any other compressible material with sufficient thermal transfer properties to transfer heat from the pluggable optical module heat pipe 18 to the clip 66 and/or contact slug 64. The compressible thermal gap filler 72 has higher heat conductivity than air and helps to fill any gaps between components, so as to increase thermal conductivity and lower thermal resistance between components. The thermal compressible gap filler may have a thermal conductivity of between approximately 1.5 W/(m*K) and 5 W/(m*K). The compressible thermal gap filler 72 may be a commercially available product, such as Bergquist thermal material products provided by Henkel Electronics Materials, LLC, of Chanhassen, Minn., or compressible thermal gap fillers 72 provided by Laird, of Earth City, Mo.

In one aspect of the present disclosure, the compressible thermal gap filler 72 may have a thermal conductivity of approximately 1.8 W/m*K.

Turning now to FIGS. 4-6, the exemplary optical module blind mating heat relay system 10 shown in the figures has two midplane heat pipes 42 for explanatory purposes. However, it will be understood that the optical module blind mating heat relay system 10 may have one, two, three, four, five, six, or more of the midplane heat pipes 42. The midplane heat pipes 42 may be thermally connected to more than one heat relay receiver assembly 40.

In one aspect of the present disclosure, as shown in FIGS. 4-6, the optical module blind mating heat relay system 10 comprises a first midplane heat pipe 42 thermally connected to a first heat relay receiver assembly 40 as well as to a second heat relay receiver assembly 40 and a third heat relay receiver assembly 40. The optical module blind mating heat relay system 10 further comprises a second midplane heat pipe 42 thermally connected to a fourth heat relay receiver assembly 40 as well as to a fifth heat relay receiver assembly 40 and a sixth heat relay receiver assembly 40.

As shown in FIG. 9, the midplane heat pipe 42 may have a first portion 80 having a substantially rectangular cross-sectional shape having a first side 82 and a second side 84. The first side 82 may be in thermal contact with the heat relay receiver assembly 40. At least part of the first portion 80 of the midplane heat pipe 42 in thermal contact with the heat relay receiver assembly 40 is shaped to matingly engage the heat relay receiver assembly 40. For example, the first side 82 of the first portion 80 may be substantially flat, as heat transfer is improved between components with greater contact between the components.

As shown in FIGS. 4-6, the midplane heat pipe 42 may have a second portion 86 in thermal contact with the radiator 46. In one aspect of the present disclosure, the second portion 86 of the midplane heat pipe 12 has a substantially rectangular cross-sectional shape. At least part of the second portion 86 of the midplane heat pipe 42 is shaped to matingly engage the radiator 46. For example, the part of the second portion 86 in thermal contact with the radiator 46 may be substantially flat, as heat transfer is improved between components with greater contact between the components.

In one aspect of the present disclosure, the midplane heat pipe 42 may be an approximately eight millimeter diameter cylindrical heat pipe flattened in portions to an approximately four millimeter thick heat pipe. In one aspect of the present disclosure, the midplane heat pipe 42 may be an approximately nine millimeter diameter cylindrical heat pipe flattened in portions to an approximately four millimeter thick heat pipe. Of course, it will be understood that the midplane heat pipe 42 may be larger or smaller. The size of the midplane heat pipe 42 may depend at least in part on available space on the linecard 12.

As shown in FIG. 5, in one aspect of the present disclosure, some portions of the midplane heat pipe 42 may have a substantially rectangular cross-sectional shape while other portions of the midplane heat pipe 42 may have a cylindrical shape.

In one aspect of the present disclosure, as shown in FIG. 4, the midplane heat pipe 42 may have a substantially rectangular cross-sectional shape along substantially the entire length of the midplane heat pipe 42.

Figure 10:
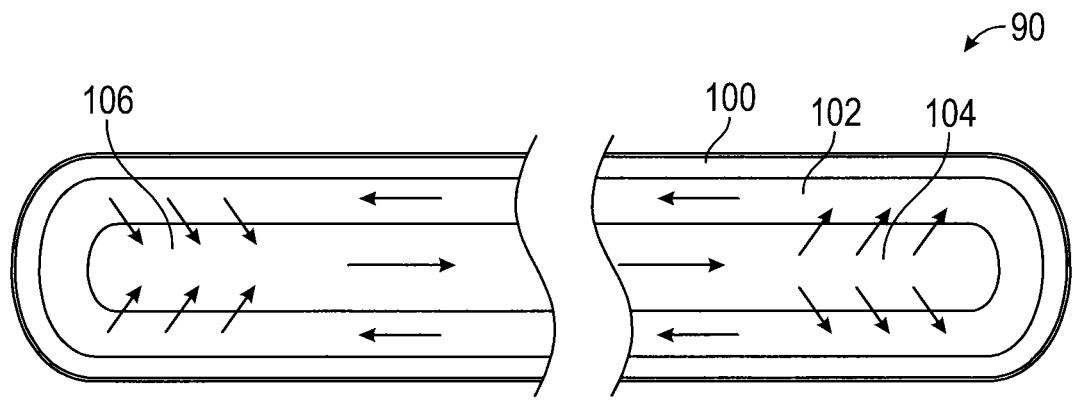
FIG. 10 is a cross sectional schematic view of a representative heat pipe constructed in accordance with the inventive concepts disclosed herein

The midplane heat pipe 42 may be comprised of thermally conductive material or combinations of materials. In one aspect of the present disclosure, the midplane heat pipe 42 may be a fluid-wick type heat pipe 90. As illustrated in the schematic of FIG. 10, in one aspect of the present disclosure, the fluid-wick type heat pipe 90 may comprise an outer wall 100 made of a highly thermally conductive material (non-exclusive examples of which include copper or aluminum) surrounding a capillary wicking material 102 and a fluid 104. Non-exclusive examples of such fluid 104 include water, acetone, methanol, and the like. When the fluid 104 in the midplane heat pipe 42 absorbs heat, the fluid 104 evaporates to vapor 106. The vapor 106 moves along the interior of the fluid-wick type heat pipe 90 to a lower temperature portion of the fluid-wick type heat pipe 90, such as the portion of the fluid-wick type heat pipe 90 in thermal contact with the radiator 46. There the vapor 106 condenses back to fluid 104, releasing thermal energy, and the fluid 104 is absorbed by the wicking material 102. The fluid 104 then flows through the wicking material 102 back to the portion of the fluid-wick type heat pipe 90 that is a higher temperature, such as the first portion of the fluid-wick type heat pipe 90.

Turning now to the radiator 46, as illustrated in FIGS. 1 and 4, the radiator 46 may comprise fins 110. The fins 110 may act to disperse heat into the surrounding air. The radiator 46 may be sized to disperse the heat from the pluggable optical modules 16. The radiator 46 may be sized to correspond to the size of the midplane circuit board 30, such that electrical connections may still be made to the midplane circuit board 30.

In one aspect of the present disclosure, the radiator 46 has a length substantially equal to the length of the back side 34 of the midplane circuit board 30.

In one aspect of the present disclosure, the radiator 46 has a length of approximately 19 inches to 20 inches. In one aspect of the present disclosure, the fins 110 of the radiator 46 have a height of approximately three-quarters of an inch and a length between approximately three-eighths of an inch and seven-sixteenths of an inch. Of course, it will be understood that the radiator 46 and the fins 110 may be of any size sufficient to disperse the heat from the pluggable optical modules 16.

In one aspect of the present disclosure, the heat relay apparatus 14 may comprise additional components for heat transfer from the midplane heat pipe 42 and the radiator 46. In one aspect of the present disclosure, the heat relay apparatus 14 may comprise a first conductor 120 in thermal contact with the midplane heat pipe 42 and the radiator 46, thus transferring heat from the midplane heat pipe 42 to the radiator 46. In one aspect of the present disclosure, the heat relay apparatus 14 may comprise a second conductor 122 in thermal contact with the midplane heat pipe 42 and the radiator 46, thus transferring heat from the midplane heat pipe 42 to the radiator 46. In applications in which the midplane heat pipe 42 is aligned substantially vertically, the first conductor 120 may be aligned vertically over the second conductor 122.

In one aspect of the present disclosure, the second portion 86 of the midplane heat pipe 42 has a first end portion 124 and a second end portion 126. The first end portion 124 is in thermal contact with the first conductor 120 and the second end portion 126 is in thermal contact with the second conductor 122.

As illustrated in FIG. 6, in one aspect of the present disclosure, the heat relay apparatus 14 may comprise a radiator heat pipe 130 located between the first and second conductors 120, 122 and the radiator 46. In one aspect of the present disclosure, the heat relay apparatus 14 may comprise two radiator heat pipes 130 located between the first and second conductors 120, 122 and the radiator 46. The radiator heat pipe(s) 130 may extend along a length of and disperse heat along the radiator 46. The radiator heat pipe(s) 130 may have a portion having a rectangular cross-sectional shape. In one aspect of the present disclosure, the radiator heat pipe(s) may be fluid-wick type heat pipe(s) 90.

Returning now to FIGS. 1 and 2, as previously discussed, the pluggable optical modules 16 are removably engaged with the linecard 12. The pluggable optical modules 16 may be inserted and removed from the linecard 12 utilizing the card guides 38. The exemplary optical module blind mating heat relay system 10 shown in the figures has six pluggable optical modules 16 for explanatory purposes. However, it will be understood that the optical module blind mating heat relay system 10 may have one, two, three, four, five, six, or more of the pluggable optical modules 16. The pluggable optical modules 16 are removably engaged with the linecard 12 and are hot-swappable. The number and purpose of the pluggable optical modules 16 may vary depending on the needs of the telecommunication system.

In one aspect of the present disclosure, the respective pluggable optical modules 16 may have a heat sink 140 located on the pluggable optical module 16. In one aspect of the present disclosure, the pluggable optical module 16 may have multiple heat sinks 140 located on the pluggable optical module 16 (not shown).

Figure 11:
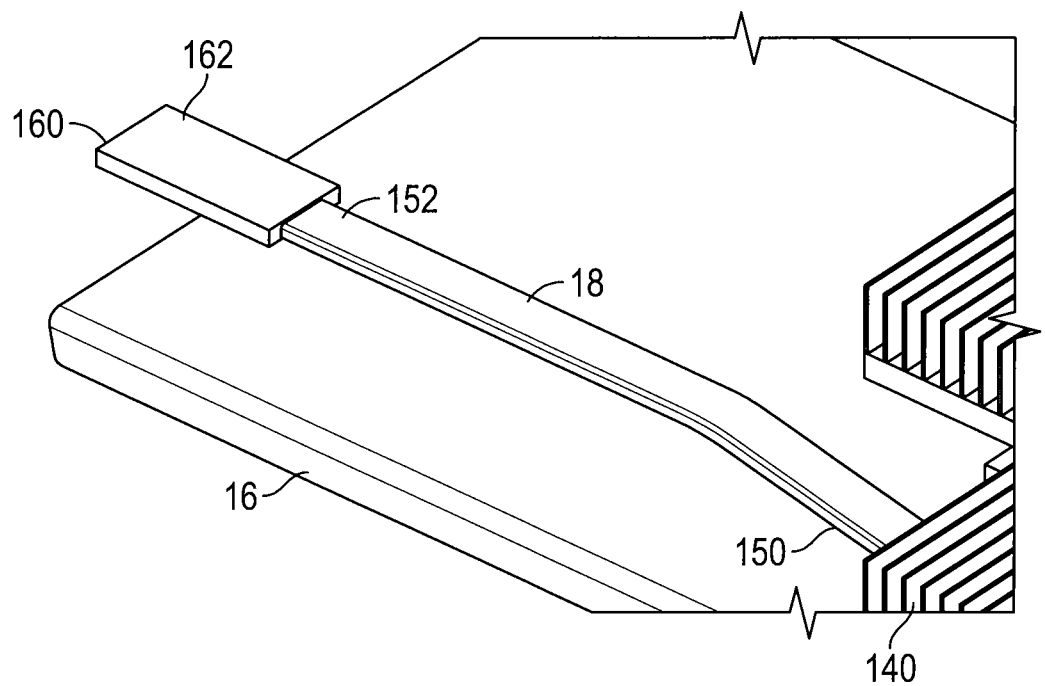
FIG. 11 is a perspective view of a pluggable optical module heat pipe constructed in accordance with the inventive concepts disclosed herein.

Turning now to the pluggable optical module heat pipe 18 illustrated in FIGS. 3 and 11, the pluggable optical module heat pipe 18 has a pluggable optical module portion 150 connected to and in thermal contact with the pluggable optical module 16. The pluggable optical module portion 150 can be soldered to the pluggable optical module 16, for example. The pluggable optical module heat pipe 18 has a plug portion 152 removably positioned within the slot 62 of the receiver housing 60 of the heat relay receiver assembly 40. The plug portion 152 is in thermal contact with the contact slug 64 so that heat is transferred out of the pluggable optical module heat pipe 18. The plug portion 152 of the pluggable optical module heat pipe 18 is removable from the receiver housing 60 of the heat relay receiver assembly 40 while the linecard 12 is receiving power.

The exemplary optical module blind mating heat relay system 10 shown in the figures has six pluggable optical module heat pipes 18 for explanatory purposes. However, it will be understood that the optical module blind mating heat relay system 10 may have one, two, three, four, five, six, or more of the pluggable optical module heat pipes 18. The pluggable optical module heat pipes 18 are removably engaged with the linecard 12 such that the pluggable optical modules 16 are hot-swappable.

In one aspect of the present disclosure, the pluggable optical module portion 150 and/or the plug portion 152 of the pluggable optical module heat pipe 18 may have a substantially rectangular cross-sectional shape. The plug portion 152 may have a substantially flat surface in thermal contact with the contact slug 64. The pluggable optical module portion 150 may have a substantially flat surface in thermal contact with the pluggable optical module 16 located on the pluggable optical module 16.

In one aspect of the present disclosure, the pluggable optical module portion 150 is in thermal contact with the heat sink 140 located on the pluggable optical module 16. The pluggable optical module portion 150 may have a substantially flat surface in thermal contact with the heat sink 140 of the pluggable optical module 16.

In one aspect of the present disclosure, the pluggable optical module portion 150 and/or the plug portion 152 of the pluggable optical module heat pipe 18 may have a thickness of approximately three millimeters. In one aspect of the present disclosure, the pluggable optical module portion 150 and/or the plug portion 152 of the pluggable optical module heat pipe 18 may have a width of approximately twelve millimeters.

In one aspect of the present disclosure, the pluggable optical module portion 150 and the plug portion 152 of the pluggable optical module heat pipe 18 may be horizontally offset from one another when the linecard 12 is in a vertical position.

The pluggable optical module heat pipe 18 may be comprised of thermally conductive material or combinations of materials. The pluggable optical module heat pipe 18 may be a fluid-wick type heat pipe 90, as previously described in conjunction with FIG. 10.

As illustrated in FIG. 11, in one aspect of the present disclosure, the optical module blind mating heat relay system 10 further comprises a thermally conductive connector 160, such as a plate, connected to the pluggable optical module portion 150 of the pluggable optical module heat pipe 18. The connector 160 is in thermal contact with the contact slug 64 of the heat relay receiver assembly 40. The connector 160 may have a substantially flat side 162 in thermal contact with the contact slug 64. In one aspect of the present disclosure, the flat side 162 of the connector 160 is in direct contact with the contact slug 64.

An example of use of the exemplary linecard blind mating heat relay system 10 of FIGS. 1-9 will be described. However, it will be understood that elements of any aspects described in the disclosure in any number or combination may be used such that the linecard blind mating heat relay system 10 may disperse heat from the pluggable optical modules 16 engaged in the linecard 12.

In use, the linecard 12 may be connected to a larger telecommunication system and actively powered. An operator may insert a pluggable optical module 16 in the linecard 12 such that the pluggable optical module 16 is guided along the card guides 38. When the pluggable optical module 16 is inserted, the plug portion 152 of the pluggable optical module heat pipe 18 is aligned with and inserted in the slot 62 of the receiver housing 60 of the heat relay receiver assembly 40, such that the leaf spring 68 of the heat relay receiver assembly 40 engages the plug portion 152 of the pluggable optical module heat pipe 18.

The clip 66 of the heat relay apparatus 14 decreases the force needed to insert the plug portion 152 of the pluggable optical module heat pipe 18 into the clip 66 in the slot 62, as well as decreasing frictional wear of the plug portion 152.

Once inserted into the slot 62, the leaf spring 68 engages and biases the plug portion 152 of the pluggable optical module heat pipe 18 against the thermal gap filler 72 toward the contact slug 64. The leaf spring 68 assists in retaining the pluggable optical module heat pipe 18 in the receiver housing 60 of the heat relay receiver assembly 40.

As the pluggable optical module 16 is operated, heat is generated by the pluggable optical module 16. The heat is transferred from the pluggable optical module 16 into the pluggable optical module portion 150 of the pluggable optical module heat pipe 18. The heat is then transferred by the pluggable optical module heat pipe 18 through the plug portion 152 of the pluggable optical module heat pipe 18 into the heat relay receiver assembly 40. The heat is conducted through the thermal gap filler 72 to the clip 66 to the contact slug 64. The contact slug 64 transfers the heat into the midplane heat pipe 42.

The midplane heat pipe 42 transfers the heat to the first conductor 120 and/or the second conductor 122. The first conductor 120 and/or second conductor 122 transfer the heat to the radiator 46 on the back side 34 of the midplane circuit board 30. The first conductor 120 and/or second conductor 122 may transfer the heat to the radiator 46 at least in part through the radiator heat pipes 130.

Air flow around the fins 110 of the radiator 46 disperses the heat out of the radiator 46 and away from the pluggable optical modules 16.

The linecard blind mating heat relay system 10 thereby disperses heat from the pluggable optical modules 16 to the heat relay apparatus 14 on the linecard 12 and then away from the linecard 12, thus decreasing the temperature of the pluggable optical modules 16 and the linecard 12.

When an operator determines that the pluggable optical module 16 should be removed or replaced, for example, due to system needs, the operator slides the pluggable optical module 16 out of the linecard 12 which causes the plug portion 152 of the pluggable optical module heat pipe 18 to disengage from clip 66 in the slot 62 of the receiver housing 60 of the heat relay receiver assembly 40. The pluggable optical module 16, or another pluggable optical module 16, may be reinserted in a similar manner as described above.

CONCLUSION

Conventionally, optical telecommunication systems have not had heat dispersal systems to move heat from the pluggable optical modules 16 out of the linecard 12. However, as power and heat requirements for pluggable optical modules 16 have increased, heat dispersal systems are needed to prevent drops in performance and failures of the pluggable optical modules 16. In accordance with the present disclosure, heat is dispersed from the pluggable optical modules 16 out of the linecard 12.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Further, while implementations have been described in the context of optical telecommunication systems, this need not be the case. These implementations may apply to supporting any type of electronic and/or optical equipment within a stacked housing, such as computer servers, power supplies, communication equipment or the like.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. An optical module blind mating heat relay system, comprising:
    a linecard comprising a circuit board having a front side connectable to a pluggable optical module and a back side opposite the front side;
    a heat relay apparatus comprising:
    a first heat pipe on the circuit board;
    a radiator in thermal contact with the first heat pipe;
    a heat relay receiver assembly comprising:
    a receiver housing having a slot; and
    a contact slug connected to the receiver housing and in thermal contact with the first heat pipe, the contact slug having a first portion and a second portion that is angled relative to the first portion, such that the first heat pipe is insertable into the receiver housing, the contact slug composed of thermally conductive material;
    a pluggable optical module removably engaged with the linecard; and
    a second heat pipe having a cross section with a substantially rectangular shape and a pluggable optical module portion contacting the pluggable optical module, and a plug portion removably positioned within the slot of the receiver housing, the plug portion being in thermal contact with the contact slug, the second heat pipe being removable from the receiver housing while the linecard is receiving electrical power.

2. The optical module blind mating heat relay system of claim 1, wherein the first heat pipe has a first portion having a substantially rectangular cross-sectional shape in thermal contact with the contact slug.

3. The optical module blind mating heat relay system of claim 1, wherein the first heat pipe has a second portion having a substantially rectangular cross-sectional shape in thermal contact with the radiator.

4. The optical module blind mating heat relay system of claim 1, wherein the plug portion of the second heat pipe has a substantially flat side in thermal contact with the contact slug.

5. The optical module blind mating heat relay system of claim 1, further comprising a thermally conductive connector attached to the plug portion of the second heat pipe, the connector having a substantially flat bottom side in thermal contact with the contact slug.

6. The optical module blind mating heat relay system of claim 1, wherein the pluggable optical module further comprises a heat sink and wherein the second heat pipe is in contact with the heat sink.

7. The optical module blind mating heat relay system of claim 1, wherein the heat relay apparatus further comprises a third heat pipe on the circuit board.

8. The optical module blind mating heat relay system of claim 1, wherein the second heat pipe is approximately 3 mm wide.

9. The optical module blind mating heat relay system of claim 1, wherein the radiator is attached to the circuit board.

10. The optical module blind mating heat relay system of claim 1, wherein the radiator is attached to the back side of the circuit board.

11. The optical module blind mating heat relay system of claim 10, wherein the radiator is thermally connected to the first heat pipe through a conductor in thermal contact with the first heat pipe.

12. The optical module blind mating heat relay system of claim 11, wherein the circuit board has a bottom portion and a top portion, wherein the conductor is a first conductor connected to the top portion of the circuit board, and wherein the heat relay apparatus further comprises a second conductor connected to the bottom portion of the circuit board and thermally connected to the first heat pipe; and wherein the radiator is thermally connected to the first heat pipe through the first conductor and the second conductor.

13. The optical module blind mating heat relay system of claim 1, wherein the heat relay receiver assembly further comprises:
    a clip located inside the slot of the receiver housing, and in thermal contact with the contact slug; and
    a leaf spring extending into the slot of the receiver housing.

14. The optical module blind mating heat relay system of claim 13, wherein the heat relay receiver assembly further comprises a compressible thermal gap filler between the second heat pipe and the clip.

15. The optical module blind mating heat relay system of claim 13, wherein the contact slug is positioned in the receiver housing, wherein the clip has a top positioned proximate to the receiver housing and a bottom in contact with the contact slug, wherein the leaf spring is positioned proximate to the top of the clip, and wherein the second heat pipe is in a biased position from the leaf spring such that the second heat pipe is in thermal contact with the bottom of the clip.

16. The optical module blind mating heat relay system of claim 15, wherein a compressible thermal material layer is located between the second heat pipe and the bottom of the clip.

17. The optical module blind mating heat relay system of claim 1, wherein a portion of the first heat pipe is approximately 4 mm wide.

18. The optical module blind mating heat relay system of claim 17, wherein the portion of the first heat pipe is in contact with the heat relay receiver assembly.

19. An optical module blind mating heat relay system, comprising:
    a linecard comprising a circuit board having a front side connectable to a pluggable optical module and a back side opposite the front side;
    a heat relay apparatus comprising:
    a first heat pipe on the circuit board;
    a radiator in thermal contact with the first heat pipe;
    a first heat relay receiver assembly comprising:
    a first receiver housing having a slot; and
    a first contact slug connected to the first receiver housing and in thermal contact with the first heat pipe, the contact slug having a first portion and a second portion that is angled relative to the first portion, such that the first heat pipe is insertable into the receiver housing, the contact slug composed of thermally conductive material; and a second heat relay receiver assembly comprising:
a second receiver housing having a slot; and
a second contact slug connected to the second receiver housing and in thermal contact with the first heat pipe, the contact slug composed of thermally conductive material;
a first pluggable optical module removably engaged with the linecard;
a second heat pipe having a cross section with a substantially rectangular shape and a pluggable optical module portion contacting the first pluggable optical module, and a plug portion removably positioned within the slot of the first receiver housing, the plug portion being in thermal contact with the first contact slug, the second heat pipe being removable from the first receiver housing while the linecard is receiving electrical power;
a second pluggable optical module removably engaged with the linecard; and
a third heat pipe having a cross section with a substantially rectangular shape and a pluggable optical module portion contacting the second pluggable optical module, and a plug portion removably positioned within the slot of the second receiver housing, the plug portion being in thermal contact with the second contact slug, the third heat pipe being removable from the second receiver housing while the linecard is receiving electrical power.

20. An optical module blind mating heat relay system, comprising:
a linecard comprising a circuit board having a front side connectable to a pluggable optical module and a back side opposite the front side;
a heat relay apparatus comprising:
a first heat pipe on the circuit board;
a second heat pipe on the circuit board;
a radiator in thermal contact with the first heat pipe and the second heat pipe;
a first heat relay receiver assembly comprising:
a first receiver housing having a slot; and
a first contact slug connected to the first receiver housing and in thermal contact with the first heat pipe, the contact slug having a first portion and a second portion that is angled relative to the first portion, such that the first heat pipe is insertable into the receiver housing, the contact slug composed of thermally conductive material; and
a second heat relay receiver assembly comprising:
a second receiver housing having a slot; and
a second contact slug connected to the second receiver housing and in thermal contact with the second heat pipe, the contact slug composed of thermally conductive material;
a first pluggable optical module removably engaged with the linecard;
a third heat pipe having a cross section with a substantially rectangular shape and a pluggable optical module portion contacting the first pluggable optical module, and a plug portion removably positioned within the slot of the first receiver housing, the plug portion being in thermal contact with the first contact slug, the third heat pipe being removable from the first receiver housing while the linecard is receiving electrical power;
a second pluggable optical module removably engaged with the linecard; and
a fourth heat pipe having a cross section with a substantially rectangular shape and a pluggable optical module portion contacting the second pluggable optical module, and a plug portion removably positioned within the slot of the second receiver housing, the plug portion being in thermal contact with the second contact slug, the fourth heat pipe being removable from the second receiver housing while the linecard is receiving electrical power.

\* \* \* \* \*